United States Patent
Fendt et al.

[11] Patent Number: 6,140,821
[45] Date of Patent: Oct. 31, 2000

[54] METHOD AND SYSTEM FOR THE RECOGNITION OF INSULATION DEFECTS

[75] Inventors: Günter Fendt, Schrobenhausen; Hans Spies, Pfaffenhofen; Peter Hora, Schrobenhausen; Guido Wetzel, Neuburg, all of Germany

[73] Assignee: Temic Telefunken Microelectronics GmbH, Heilbronn, Germany

[21] Appl. No.: 09/105,140

[22] Filed: Jun. 26, 1998

Related U.S. Application Data

[63] Continuation-in-part of application No. 08/673,593, Jul. 1, 1996, abandoned.

[30] Foreign Application Priority Data

Jul. 6, 1995 [DE] Germany .................. 195 24 615

[51] Int. Cl.$^7$ .................................................. G01M 19/00
[52] U.S. Cl. ........................... 324/502; 324/550; 340/436
[58] Field of Search ..................... 324/502, 550; 340/436

[56] References Cited

U.S. PATENT DOCUMENTS 5,268,643 12/1993 Aso ......................................... 324/502

*Primary Examiner*—Safet Metjahic
*Assistant Examiner*—Jose M. Solis
*Attorney, Agent, or Firm*—Venable; Norman N. Kunitz

[57] ABSTRACT

The invention concerns a method for the recognition of insulation defects in a circuit adapted for connection to a low-ohmic current source or sink having off-load voltage $U_{n0}$. Towards this end the circuit is initially subjected, in a separated state, to a diagnostic voltage from a current limited current source or sink whose off-load voltage $U_{h0}$ corresponds to exceeds or, respectively, is less than the voltage $U_{n0}$. A decision is made as to the presence or absence of an insulation defect based on the current and/or voltage dependence during application of the diagnostic voltage. Finally, in the event that a defect is present, an error message is issued and the low-ohmic current source or sink is not connected to the circuit for self-diagnosis. Otherwise, the low-ohmic current source is connected to the circuit, or the sink, in sequential fashion for self-diagnosis testing. In this fashion even hidden insulation defects are recognized. The invention also concerns a system for carrying out this method.

17 Claims, 3 Drawing Sheets

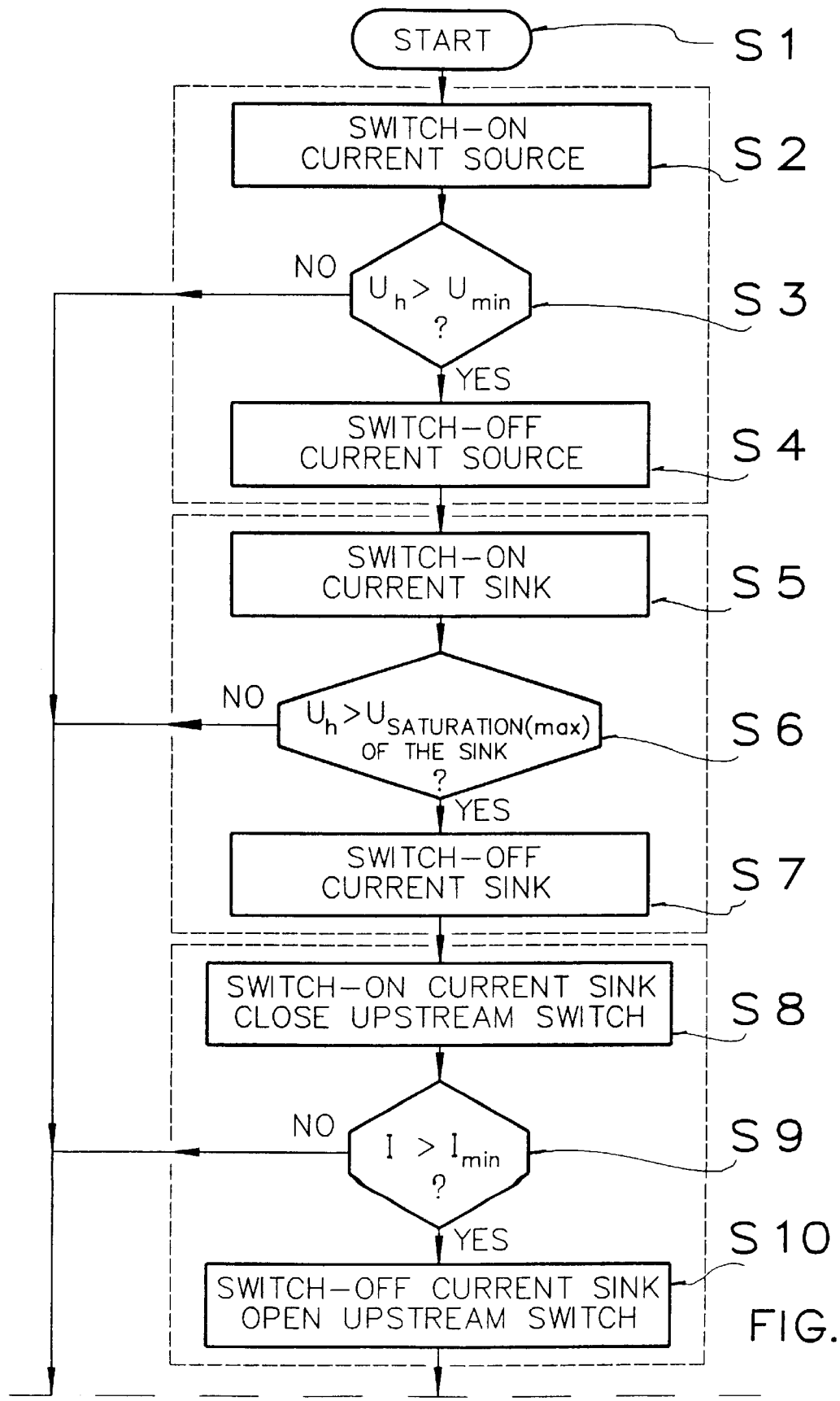
FIG.2/1

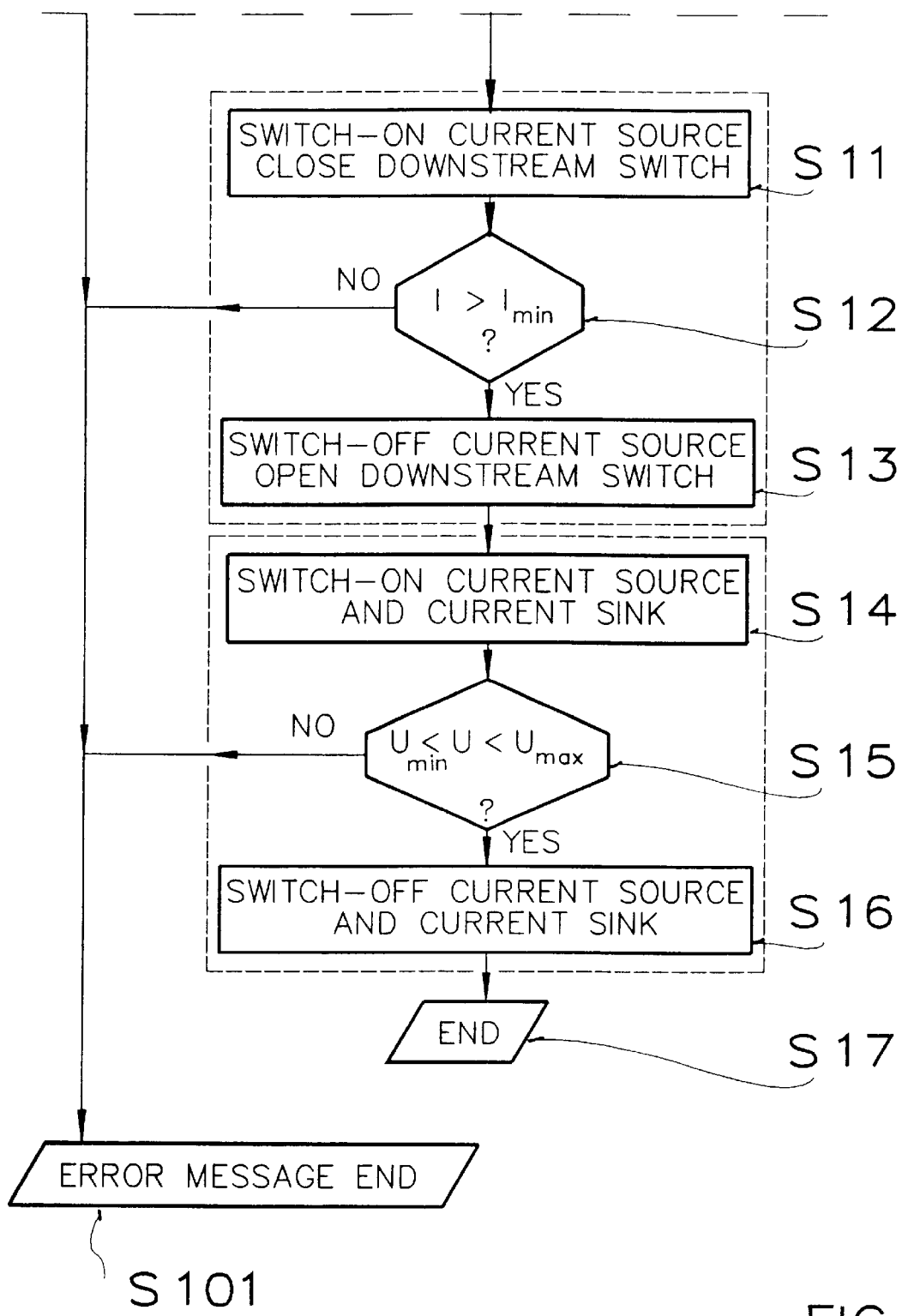
FIG.2/2

METHOD AND SYSTEM FOR THE RECOGNITION OF INSULATION DEFECTS

This application is a continuation in part of application Ser. No. 08/673,593, now abandoned, filed Jul. 1, 1996 and claiming Paris Convention priority of German patent application Ser. No. 195 24 615.2 of Jul. 6, 1995 the complete disclosure of which are hereby incorporated by reference.

BACKGROUND OF THE INVENTION

The invention concerns a method and a system for the recognition of insulation defects in a circuit designed for connection to a low-ohmic current source or sink having an off-load voltage $U_{n0}$.

The terms "current source" and "current sink" each designate a single terminal device (which, of course, can have additional terminals for its supply of power) which can deliver or receive current. For example, a battery having a positive and negative terminal is a combination of a current source and a current sink.

"Low-ohmic" designates that the current source or sink can, in the event of a short in the circuit, supply a sufficiently large current to cause disadvantageous results. In contrast thereto, the current of a high-ohmic or current limited current source remains relatively small and cannot have such effects.

An example of such a low-ohmic current source and sink is an automobile battery which can be connected via a cable to electrical utilities. In the event that a short to ground occurs in a utility due to an insulation defect, for example in the starter, connection to the current source (e.g. the positive terminal of the battery) can lead to high short-circuit current, to heating of the connecting cable, and to a fire in a cable bundle.

Another example of a low-ohmic current source and sink is the current supply for triggering the ignition pellet of an airbag system in a motor vehicle. Normally, both terminals of the ignition pellet are separated from the current source. However, as will be described in more detail below, one terminal is connected to the low-ohmic current source (i.e. the positive terminal of the current source) during internal diagnostic checking of the airbag system. In the event that its other terminal is shorted to ground due to an insulation defect, ignition thereof and consequently of the airbag is unintentionally effected.

In particular, a conventional airbag system generally exhibits two power switches for complete decoupling of the ignition pellet under normal operating conditions of which one is in the current path between the low-ohmic current source (e.g. the positive terminal of the current supply) and one terminal of the ignition pellet and the other in that between the other terminal of the ignition pellet and the low-ohmic current sink (i.e. to ground). When both switches are closed, the ignition pellet ignites. In order to verify its functionability, a system of this type performs repeated internal checks. Towards this end all components of the system are checked, including not only the collision sensors, ignition and self-sufficient capacitors but also, in particular, the ignition pellet and the two power switches. In order to check the ignition pellet, one terminal of the ignition pellet is connected to a current limited current source and the other to a current limited current sink with the power switches open. As a result, a limited diagnostic current flows through the ignition pellet within a range not leading to ignition. The voltage drop across same is checked and evaluated. In order to check the power switch one switch is closed at a time so that a diagnostic current flows, in one case, from the low-ohmic current source through the closed switch and the ignition pellet to the current limited current sink and, in the other case, from the current limited current source through the ignition pellet and the closed switch to the low-ohmic current sink. Hereby, the diagnostic current is only limited by the current limited current source or sink on the side of the open switch; that on the side of the closed switch is, in each case, in parallel with the low-ohmic current source or sink and therefore has no effect. The diagnostic check then consists, in each case, of an evaluation of the current flowing through the switch which can be sampled by a sensing device. However, a short-circuit can—as already mentioned above—thereby lead to unintentional ignition of the airbag. In the first case mentioned above, a short to the low-ohmic current sink (i.e. to ground) nullifies the current limitation of the current sink and—to the extent that it is located on the downstream side of the ignition pellet—allows the full ignition current to flow, leading to unintentional ignition. Similar results obtain, although with reduced probability when, in the second case mentioned above, a short-circuit to the low ohmic current source (a so-called local short to the voltage U of the battery) occurs on the upstream side of the ignition pellet.

The conventional method for preventing such unintentional ignition provides for a check of shorts to ground prior to the switch diagnostic check by connecting the ignition pellet to a diagnostic potential which has a sufficiently low level above ground that the diagnostic current cannot lead to ignition in the event of a short to ground. One measures the diagnostic voltage and, in the event that it lies below a prescribed value, concludes that a short-circuit is present and therefore does not carry out the otherwise subsequent diagnostic check of the switch. In this manner it is possible to prevent an unintentional ignition of the airbag in most cases. Nevertheless, there is still an unacceptably large probability of unintentional ignition during switch diagnostic checks.

It has been recognized that these remaining unintentional ignitions are usually due to insulation defects which are not recognized in the above described short-circuit diagnostic check using relatively low diagnostic voltages. This is due to the presence of, for example, cable locations with worn-through insulation, and metallic particles or slivers, especially in the region of the ignition pellet plug, which do not initially effect contact to ground and therefore are not evident during diagnostic checks using low diagnostic voltage. Only when the relatively high static voltage is applied during the subsequent switch diagnostic check is contact established due to the relatively large attractive electrostatic forces. An initial flow of current causes a "welding together" at the contact location and therefore an additional reduction in the bridging resistance so that a short to ground and an unintentional ignition of the airbag occurs.

The technical problem underlying the invention is to overcome these disadvantages.

SUMMARY OF THE INVENTION

The invention solves this problem with a method for the recognition of insulation defects in a circuit designed for connection to a low-ohmic current source or sink having off-load voltage $U_{n0}$ with which a) a diagnostic voltage from a current limited current source or sink whose off-load voltage $U_{h0}$ corresponds to or exceeds the voltage $U_{n0}$ or—in the event of a current sink—is less than same (the indices "n" and "h" represent "low-ohmic" and "high-ohmic" respectively) is applied to the circuit in a separated state;

b) based on the dependence of the current and/or voltage during application of the diagnostic voltage, a decision is made as to the presence or absence of an insulation defect; and c1) in the event that such a defect is present, an error message is issued and the low-ohmic current source or sink is not connected to the circuit;

c2) in the event that a defect does not occur the low-ohmic current source or sink is connected to the circuit.

With this solution the separated circuit is already, through application of the diagnostic voltage in step a), brought to a potential which corresponds to that present during subsequent connection to the low-ohmic current source or sink (i.e., in the above mentioned airbag example, during the corresponding switch diagnostic check). In this fashion the maximum electrostatic forces are already present in step a) so that a hidden insulation defect is already evident here through the occurrence of a short-circuit. Since, however, the current is limited this does not lead to disadvantageous results, rather only leads to a breakdown of the diagnostic voltage. In the event that a short-circuit is present from the outset, the diagnostic voltage cannot establish itself due to the current limitation. This current and/or voltage dependence serves to identify the insulation defect in subsequent step b).

The method in accordance with the invention has the advantage that even insulation defects which remain hidden at low diagnostic voltages can be reliably recognized to thereby practically eliminate short-circuits with disadvantage consequences such as, for example, the burning-up of a bundle of cables or the unintentional ignition of an airbag.

In many applications further checks are carried out in addition to the procedure mentioned above. Towards this end it can be advantageous not only to carry these out after completion of the step sequence a) through c1) or c2) rather in a manner which is nested therein. Accordingly, other method steps can be inserted between the steps b) and c2) or between b) and c1). In certain cases, such as in the above example of airbag switch diagnosis, the additional diagnostic check comprises a repetition of the method in accordance with the invention, whereby the method is initially carried out for the low-ohmic current source and then for the complementary low-ohmic current sink or vice versa (this procedure is defined herein as the "complementary method"). In principle, one can do this by carrying out the method in its entirety in sequence, for the current source and the current sink, one after the other. In order to join together the diagnostic phases (i.e. the steps a) and b)) one, however, preferentially chooses a nested embodiment with which, after the steps a) and b), for example for the low-ohmic current source, the corresponding steps a) and b) for the complementary current sink are carried out and then, in the event that no defect is found, step c2) for both. Step c1), which is to be carried out in the event of a defect, (i.e. issuing of an error message) can alternatively be carried out directly following a) and b) or after the inserted steps of the complementary method.

A conclusion concerning the presence of an insulation defect in step b) can preferentially be drawn by measuring the current caused by the diagnostic voltage and asking whether or not its magnitude exceeds a prescribed limit. However, it is simpler and therefore preferable to measure the diagnostic voltage $U_h$ which establishes itself (and which breaks down in the event of a short circuit) and to ask whether or not it lies below or—in the case of a current sink—above a prescribed limit.

In principle, the method can be utilized with any circuit with which insulation defects can have disadvantageous consequences in connection with a low-ohmic current source or sink. It is advantageous when the circuit is part of a system which is capable of self-diagnosis, whereby the method is carried out within the framework of a self-diagnosis of this system. Preferentially, one is concerned with a device for triggering a motor vehicle safety system such as, for example, a roll-protection system, a safety belt tightening system or an airbag system. In particular for the latter, an unintentional triggering carries with it a substantial probability for causing an accident so that in this case the method, which practically eliminates such an unintentional triggering, is particularly advantageous.

It is preferred when, within the framework of self-diagnosis, the last method step with which the circuit is connected to the low-ohmic current source or current sink (step c2), is used to check a circuit power switch used, for example, in a triggering device to control the triggering current. The circuit diagnostic check can, in particular, involve the evaluation of the current flow sampled at the closed power switch.

During circuit diagnosis one preferentially uses a current limited current sink or source, respectively, to compensate for the low-ohmic current source or sink. This type of "complementary" current limitation has, as has already been explained above, the inherent danger of unintentional triggering due to hidden insulation defects which, however, is prevented in accordance with the invention.

When carrying out the method and the complementary method it is particularly simple and therefore preferred to utilize the same and not different current limited current sources or sinks, respectively, for insulation diagnosis in step a) and in the complementary switch diagnosis of step c2).

In general, during self-diagnosis of a safety system, not only the power switch but also a trigger element activated thereby, in particular an airbag ignition means, are checked. Towards this end it is possible, for example, to evaluate the voltage drop across the trigger element during application of a low diagnostic current (in the non-triggering region). For voltage-free diagnosis of the trigger element, the diagnostic current is supplied from a current limited current source and sink with open power switches. It is advantageous to thereby utilize the current source or sink utilized in the resistive measurement of step a) and the switch diagnostic check of step c2). Transition from one to another operational mode is done in a simple fashion by activating both together for diagnosis of the trigger element and each separately for diagnosis of the insulation. Both common activation as well as individual activation can be used for switch diagnostics, since one of the current limited current sources or sinks is connected in parallel via the closed power switch with the low-ohmic current source or sink in each case and therefore has no effect even in the activated state.

The invention is also directed to a system for carrying out the above method with:

one or more current limiting currents sources and/or sinks whose off-load voltages $U_{h0}$ correspond to at least or—in the case of a current sink—at most the voltage $U_{n0}$ for applying a diagnostic voltage to the circuit in a separated state;

means for deciding whether or not an insulation defect is present based on the current and/or voltage dependence during application of the diagnostic voltage; and means for issuing an error message and for preventing connection of the low-ohmic current source or sink to the circuit in the event that an insulation defect is present and, in the event that no such defect is present, for connecting same to the circuit.

These means advantageously primarily comprise at least one suitable programmable microcomputer.

The system is preferentially part of a system which is capable of self-diagnosis, whereby the designation "part" also includes the limiting case where the system constitutes the entire self-diagnosis capable system. The invention concerns a triggering device for a motor vehicle safety system, for example, an airbag system.

Further advantageous embodiments of the system are given in the dependent claims. More detailed description of same is found in the above description of the method.

The invention is now further described with respect to embodiments and the accompanying schematic diagrams:

BRIEF DESCRIPTION OF THE DRAWING

FIG. 2 shows a flow chart of a self-diagnostic method of an airbag system in which a method for recognition of insulation defects is embedded.

DESCRIPTION OF THE PREFERRED EMBODIMENT

Figure 1:
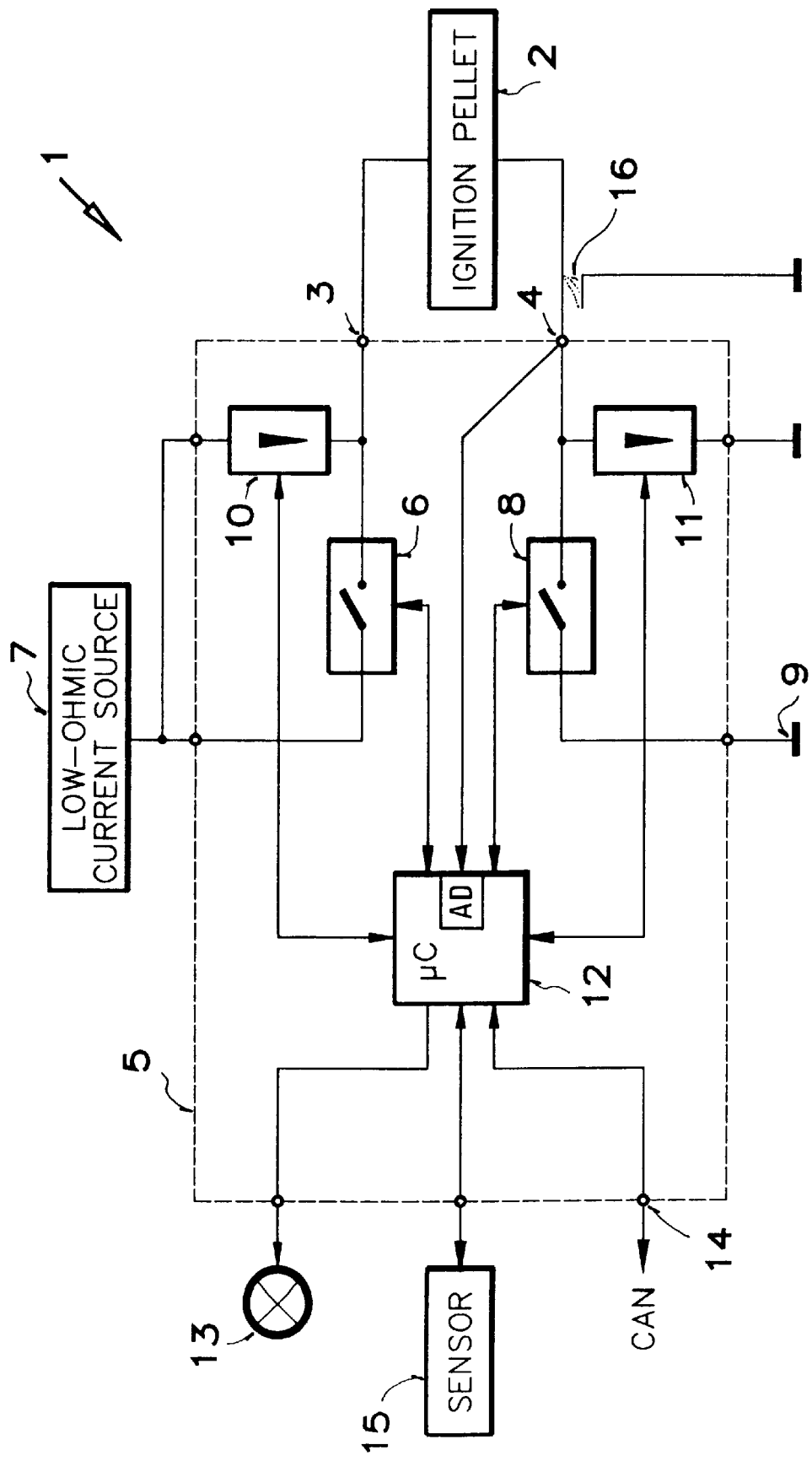
FIG. 1 shows a block diagram of an airbag system which includes a system for recognition of insulation defects.

The airbag system 1 in accordance with FIG. 1 comprises an ignition means, in this case an ignition pellet 2, for triggering an airbag (not shown). Same is connected with each of its two connecting cables via a plug-connection 3, 4 to a trigger and diagnostic circuit 5, on one side via an upstream power switch 6 to a low-ohmic current source 7 and on the other side via a downstream power switch 8 to ground 9 functioning as a low-ohmic current sink. The power switches 6, 8 are electronically controllable switches, in particular semiconductor switches, for example in the form of final stage amplifiers. A current limited current source 10 is connected in parallel with the upstream power switch 6. Complementary thereto, a current limited current sink 11 is connected in parallel with the downstream power switch 8.

The low-ohmic current source 7 has an off-load voltage $U_{n0}$ relative to ground 9 which assumes a value of, for example, 30 V. The off-load voltage $U_{h0}$ of the current limited current source 10 is equal thereto and therefore also assumes a value of 30 V relative to ground 9. The same is true for the off-load voltage $U_{h0}$ of the current limited current sink 11 which equals that of ground 9 to therefore assume a value of 0 V. "Low-ohmic" designates that the current delivered by the current source 7 and received at ground 9 is sufficiently large during connection to the ignition pellet 2 to trigger same. In contrast thereto, the current limitation of the current source 10 and the current sink 11 is such that when they are connected to ignition pellet 2, the current delivered by or received by same cannot initiate triggering. The maximum current is typically less than 100 mA and, in particular, lies between 20 and 40 mA. Differing current limits are possible: for example, the current source 10 can have 20 mA and the current sink 11 40 mA so that only one of them determines the current limit.

A microcomputer 12, for example a microcontroller, can operate the power switches 6, 8 independently of another and can switch the current limited current source 10 and current sink 11 on and off independently of another. It can also record information concerning the current flowing through the power switches 6, 8 which is sensed with the assistance of a current measuring circuit (not shown). It can further read the voltages before and after the ignition pellet 2 measured by voltage measuring circuits (not shown). Finally, it can also drive an error message issuance device 13, for example a lamp, and communicate with other motor vehicle or diagnostic devices via communication interface 14, for example via a CAN-bus. A collision sensor 15 signals the microcomputer 12 in the event that the airbag should be triggered. The microcomputer 12 is programmed in such a fashion that it can carry out the self-diagnostic method in accordance with FIG. 2 which is further described below.

The trigger and diagnostic circuit 5 can assume the following states: In the normal state both power switches 6, 8 are open and the current limited current source 10 and current sink 11 are switched-off. In the event of a trigger, both power switches 6, 8 are closed and the ignition pellet 2 ignites. For self-diagnosis there are at least three different operating modes. In a first operating mode the ignition pellet 2 can be checked by evaluating the voltage drop across same resulting from the flow of limited diagnostic current with opened power switches 6, 8 and with simultaneously switched current limited current source 10 and current sink 11. In a second operation mode the power switches 6, 8 are checked with commonly switched-in current limited current source 10 and current sink 11 and with only one of the switches 6, 8 being closed at a time with the diagnostic current flowing therethrough being evaluated. The complementary side is evaluated with separately switched-in current source and current sink. If, in the first case, the upstream power switch 6 is closed, a diagnostic current flows from the low-ohmic current source 7 through same and via the ignition pellet 2 to the current limited current sink 11. Since only the latter limits the current, nearly all of the voltage drops across same so that the entire ignition circuit lying upstream thereof is raised to the off-load voltage $U_{n0}$ of the low-ohmic current source 7. If, on the other hand, the downstream power switch 8 is closed, a diagnostic current flows from the current limited current source 10 through the ignition pellet 2 and the downstream switch 11 to ground 9. In this case the current limitation is only effected by the current limited current source 10 so that the entire ignition circuit downstream thereof lies at nearly ground potential.

As already described above this checking of the power switches 6, 8 per se, can lead to an unintentional triggering of the airbag in the event of an insulation defect. A metallic sliver 16 which does not initially cause contact to ground is shown in the vicinity of the downstream plug-connection 4 in order to illustrate a hidden insulation defect. This remains unnoticed using conventional leakage connection diagnostics at low diagnostic voltages. In the event of diagnosis of the upstream power switch 6, the entire ignition circuit is raised to the relatively high voltage $U_{n0}$ so that it can now establish electrical contact to ground due to the thereby increased electrostatic forces; the current limiting effect of the current sink 11 is eliminated, and the ignition pellet 2 is ignited. The same can occur—although with reduced probability—during diagnosis of the downstream power switch 8 in the event that an insulation defect in the upstream part of the circuit causes a connection to the low-ohmic current source 7.

In order to prevent this from occurring it is possible, in a third diagnostic operation mode for insulation diagnosis, to individually switch-on and -off the current limited current source 10 and current sink 11 with open power switches 6, 8. In the event that no insulation defect is present, in the first case of switched-in current limited current source 10 and switched-off current sink 11, no current flows in the ignition circuit due to the separation caused by open switches 6, 8, and the high off-load voltage $U_{h0}$ corresponding to the voltage $U_{n0}$ of the low-ohmic current source 7 establishes itself. In the event of an evident insulation defect, i.e. a short to ground which was present from the beginning, the voltage in the ignition circuit remains close to ground potential due to the current limitation of the current source 10. In the event of an insulation defect which is hidden, for example the sliver 16, the ignition circuit is initially raised to a relatively high voltage in a direction towards the off-load voltage $U_{h0}$. The increasing electrostatic forces which thereby occur then cause a short to ground as a result of which the voltage in the ignition circuit breaks down to a value close to ground potential. The voltage which results in the ignition circuit, which for example can be sensed with the voltage measuring circuit (not shown) at the ignition pellet 2, then indicates the presence or absence of an insulation defect. During the course of the insulation diagnostic itself, an unintentional triggering of the airbag is not possible due to current limitation. The same is true for the second case with which the current limited current sink 11 is switched-in and the current source 10 switched-off.

In this embodiment of the invention shown in FIG. 1, the ignition pellet 2 has an off-load voltage of 5 V at reference point 4 of the circuit and the current limited source 10 applies a voltage of 30 V to the circuit. The microcontroller 12 comprises an analog/digital (AD) converter for measuring and digitizing the voltage applied to the ignition pellet 2 at reference location 4. All triggering circuits require testing of the switches 6 and 8. Although testing of switch 8 does not normally produce problems, testing of switch 6 can lead to unintentional triggering of the ignition pellet 2. In order to test switch 6 it is necessary to switch-in the current limiting source 11. If there is no insulation defect in the circuit, the current from the current limited source 11 flows through the ignition pellet 2 with an amount of current not sufficient to ignite it. If, however, an insulation defect were present at point 16, the amount of current flowing through the ignition pellet 2 would increase and no longer be limited by source 11. The subsequent current flow could initiate an improper triggering of the ignition pellet during the test phase of switch 6.

The circuit shown in FIG. 1 prevents this unintentional triggering during testing when operated in accordance with the invention. The off-load voltage on the ignition pellet of 5 V is first checked in the AD converter of the microcontroller. In the event that a voltage strongly deviating from 5 V, for example 0 V or 12 V, is measured an error message is produced and no subsequent switch tests are carried out. If, however, the AD converter senses 5 V at point 4 in the circuit, current limited current source 10 is connected, switches 6 and 8 opened, and current source 11 is disconnected. In this manner, a voltage of approximately 30 V is present on ignition pellet 2 and at point 4 of the circuit. This voltage is sufficiently high compared to the off-load voltage of 5 V that a voltage breakdown occurs if an insulation defect is present at point 16. The larger the difference between the applied voltage e.g. of 30 V and the off-load voltage of e.g. 5 V, the sooner the voltage breakdown occurs and the sooner an insulation defect is recognized. In the event that a voltage breakdown occurs, the applied voltage of 30 V drops to approximately 0 V and an amount of current flows which is, however, limited by the current limited source 10. If the AD converter measures a voltage of 0 V, an insulation defect is thereby signaled, an error message is issued, and the above described test for switch 6 is not carried out. If, however, the AD converter registers a voltage of about 30 V, no insulation defect is present. If no breakdown occurs at 30 V then a breakdown at the reduced off-load voltage of 5 V is very unlikely. Under these circumstances testing of switch 6 is then carried out, since an improper triggering during this test caused by an insulation defect has been ruled out.

The applied voltage signal is converted into a digital signal in the AD converter to measure these voltages. Towards this end it is not necessary that the AD converter be precise over the entire region between 0 V and 30 V. It is sufficient to be able to recognize a low voltage of ca. 0 V having no or only a very few number of bits in the AD converter and an analog value of 30 V having, in contrast thereto, nearly all bits set. The off-load voltage of 5 V gives a bit value intermediate between these two extremes. It is therefore only necessary to perform a relative voltage measurement to determine whether or not the measured value is larger or smaller than, for example, 5 V.

Microcontrollers having integrated AD converters are well-known in the art. The voltage measurements can be carried out with a number of differing instruments including a voltmeter, a relative voltage measuring circuit or with any other suitable circuit device which is capable of differentiating between these three differing voltage regions.

The diagnostic method in accordance with FIG. 2 begins at step S1 with both power switches 6, 8 in the open state and with the current limited current source 10 and current sink 11 switched-off; the low-ohmic current source 7 is always active (note: "current source" and "current sink" in FIG. 2 always designate the current limited ones). In a first part of the method, an insulation diagnosis is initially carried out with high current-limited voltage on the ignition circuit. Towards this end the current limited current source 10 is switched-in in step S2. The following step S3 asks whether the voltage $U_h$ which establishes itself in the ignition circuit exceeds a prescribed minimal voltage $U_{min}$, in this case 4.5 V. If this is not the case, then an insulation defect is present so that an error message is issued in step S101 via the error message issuing device 13 and the method is ended. If yes, then the first part of the method is completed in step S4 with the switching-off of the current limited current source 10.

In a second part of the method, the insulation diagnosis is carried out with current limited voltage at ground potential. Towards this end the current limited current sink 11 is switched-in in step S5. In step S6 one asks whether the voltage $U_h$ establishing itself in the ignition circuit is smaller than or equal to the maximum saturation voltage of the sink. If no, then an error message is issued in step S101 and processing is ended. If yes, then no insulation defect is present; the second part of the method is then completed in step S7 by switching-off the current limited current sink 11.

In the third part of the method for checking the upstream power switch 6, the current limited current sink 11 is switched-in in step S8 (alternatively the current source 10 and sink 11 can be commonly switched-in) and the switch 6 is closed. In step S9 one asks whether the current flowing therethrough is larger than a prescribed minimum current $I_{min}$, in this case 10 mA. If no, then an error message is issued in step S101 and processing is ended. If yes, the third part of the method is completed in step S10 by switching-off the current sink 11 and by opening the upstream power switch 6 which is considered to be functionable.

In the fourth part of the method for checking the downstream power switch 8, the current limited current source 10 is switched-in in step S11 and the switch 8 is closed. One asks in step S12 whether or not the current dropping through same exceeds a prescribed minimum current $I_{min}$, in this case 10 mA. If no, an error message is issued in step S101 and processing is ended. If yes, then the fourth part of the method is ended in step S13 through switching-off the current source 10 and opening the downstream power switch 8 which is considered to be functionable.

Finally, the ignition pellet 2 is checked in the fifth part of the method. Towards this end the current limited current source 10 and current sink 11 are switched-in together in step S14. One asks in steps S15 whether or not the voltage dropping across ignition pellet 2 lies within a prescribed voltage range $U_{min} \ldots U_{max}$. If no, an error message is issued in step S101 and processing is ended. If yes, the ignition pellet 2 is viewed as functionable; the fifth part of the method is then completed in step S16 by switching-off the current limited current source 10 and current sink 11. The diagnostic procedure is ended without defects in step S17.

In other embodiments (not shown) the parts of the method are carried out in a different sequence; for example the fifth part (ignition pellet diagnosis) can be done immediately after the beginning (step S1). In another example the checking of a switch can be done, in each case, directly following the corresponding insulation diagnosis, i.e. the third part directly follows the first, and the fourth directly follows the second. Important for all these variations is only that a diagnosis of the switch precedes the corresponding diagnosis of the insulation in each case, that is to say, the first part precedes the third and the second precedes the fourth.

In order to illustrate this rearrangement of the parts of the method, the example of FIG. 2 also contains method steps which are not necessary per se (for example the pair S7 and S8) and which could be eliminated in a prescribed sequence.

We claim:

1. A method for the recognition of insulation defects in a safety circuit for triggering an ignition pellet of an airbag system in a motor vehicle, the circuit adapted for connection to a low-ohmic terminal device having an off-load voltage magnitude $|U_{no}|$, the method comprising the steps of:

a) applying a diagnostic voltage to the circuit from a current limited terminal device, said current limited device having an off-load voltage magnitude $|U_{ho}|$ greater than or largely equal to $|U_n|$;

b) measuring said diagnostic voltage in the circuit to decide on a presence of an insulation defect should said diagnostic voltage have a magnitude less than a magnitude of a prescribed limiting value;

c) issuing an error message if said insulation defect is present in step b) and preventing connection of the low-ohmic device to the circuit;

d) connecting the low-ohmic device to the circuit if no insulation defect is present in step b).

2. The method of claim 1, wherein the circuit is part of a system capable of self-diagnosis and further comprising the step of applying the method to a self-diagnosis of said system.

3. The method of claim 2, wherein said self-diagnosis capable system is a motor vehicle safety system.

4. The method of claim 2, wherein in step d), a circuit power switch is checked through connection to the low-ohmic device.

5. The method of claim 4, wherein step d) comprises the step of switching-in a current limited switch device to compensate for the low-ohmic terminal device.

6. The method of claim 5, wherein said switch device is said current limited terminal device.

7. The method of claim 1, wherein said current limited device is a current source, the low-ohmic device is a current source, and the circuit further comprising a low-ohmic current sink having an off-load voltage magnitude $|U_{nOn}|$, the method further comprising the steps of:

aa) applying, following step b), a second diagnostic voltage to the circuit from a current limited current sink having an off-load voltage magnitude $|U_{hOn}|$ greater than or largely equal to $|U_{nOn}|$; and bb) measuring said second diagnostic voltage in the circuit to decide on a presence of an insulation defect should said second diagnostic voltage have a magnitude less than a magnitude of a prescribed limiting value.

8. The method of claim 7, further comprising the step of switching-in both said limited source and said limited sink to diagnose a trigger element of the circuit.

9. A device for the recognition of insulation defects in a safety circuit for triggering an ignition pellet of an airbag system in a motor vehicle, the circuit adapted for connection to a low-ohmic terminal device having an off-load voltage magnitude $|^{no}|$, the device comprising:

means for applying a diagnostic voltage to the circuit from a current limited terminal device, said current limited device having an off-load voltage magnitude $|U_{ho}|$ greater than or largely equal to $|U_{no}|$;

means for measuring said diagnostic voltage in the circuit to decide on a presence of an insulation defect should said diagnostic voltage have a magnitude less than a magnitude of a prescribed limiting value;

means for issuing an error message if said insulation defect is present and for preventing connection of the low-ohmic device to the circuit; and means for connecting the low-ohmic device to the circuit if no insulation defect is present.

10. The device of claim 9, wherein said current limited device is a current source, the low-ohmic device is a current source, and the circuit having a low-ohmic current sink having an off-load voltage magnitude $|U_{nOn}|$, the device further comprising:

means for applying a second diagnostic voltage to the circuit from a current limited current sink having an off-load voltage magnitude $|U_{hOn}|$ greater than or largely equal to $|U_{nOn}|$; and means for measuring said second diagnostic voltage in the circuit to decide on a presence of an insulation defect should said second diagnostic voltage have a magnitude less than a magnitude of a prescribed limiting value.

11. The device of claim 10, wherein the circuit further comprises a source power switch and a sink power switch, said source switch connected to the low-ohmic source and said sink switch connected to the low-ohmic sink, the circuit adapted for checking said source switch and said sink switch during said self-diagnosis.

12. The device of claim 11, further comprising a current limited switch source and a current limited switch sink, said switch source and said switch sink for compensation of the low-ohmic source and the low-ohmic sink during power switch diagnosis.

13. The device of claim 11, wherein the device for using said current limited source and said current limited sink to diagnose insulation defects and to diagnose power switch defects.

14. The device of claim 13, wherein said current limited sink and said current limited source for individual activation to diagnose insulation defects and for joint activation to diagnose trigger element defects.

15. The device of claim 9, wherein the circuit is part of a system capable of self-diagnosis and further comprising means for self-diagnosing said system.

16. The device of claim 15, wherein said self-diagnosis capable system is a motor vehicle safety system.

17. The device of claim 10, further comprising means for switching-in both said limited source and said limited sink to diagnose a trigger element of the circuit.

* * * * *